(12) United States Patent
Schultheiss et al.

(10) Patent No.: US 10,281,313 B2
(45) Date of Patent: May 7, 2019

(54) RADAR FILL LEVEL MEASUREMENT DEVICE COMPRISING A PHASE-LOCKED LOOP

(71) Applicant: VEGA Grieshaber KG, Wolfach (DE)

(72) Inventors: Daniel Schultheiss, Hornberg (DE); Christoph Mueller, Oppenau (DE)

(73) Assignee: VEGA GRIESHABER KG, Wolfach (DE)

( * ) Notice: Subject to any disclaimer, the term of this patent is extended or adjusted under 35 U.S.C. 154(b) by 0 days.

(21) Appl. No.: 15/973,996

(22) Filed: May 8, 2018

(65) Prior Publication Data

US 2018/0328773 A1 Nov. 15, 2018

(30) Foreign Application Priority Data

May 9, 2017 (DE) ........................ 10 2017 207 783

(51) Int. Cl.
*G01F 23/284* (2006.01)
*G01S 13/88* (2006.01)
(Continued)

(52) U.S. Cl.
CPC ............ *G01F 23/284* (2013.01); *G01S 7/036* (2013.01); *G01S 7/35* (2013.01); *G01S 13/88* (2013.01); *H03L 7/08* (2013.01); *H03L 7/099* (2013.01)

(58) Field of Classification Search
CPC ..... G01F 23/284–23/2845; G01S 7/03–7/038; G01S 7/35; H03L 7/099–7/0998
See application file for complete search history.

(56) References Cited

U.S. PATENT DOCUMENTS 5,606,513 A 2/1997 Louwagie et al.
8,098,193 B2 1/2012 Sai et al.
(Continued)

FOREIGN PATENT DOCUMENTS

EP 2 215 535 8/2010
EP 3 279 619 A1 2/2018
(Continued)

OTHER PUBLICATIONS

Schott. Matthias: "Methoden zur Phasenrauschverbesserung von monolithischen Millimeterwellen-Oszillatoren"; Dissertation an der Technischen Universität Berlin, 2008 (126 pages).
(Continued)

*Primary Examiner* — Matthew M Barker
(74) *Attorney, Agent, or Firm* — Oblon, McClelland, Maier & Neustadt, L.L.P.

(57) ABSTRACT

A radar fill level measurement device for determining a fill level of a medium is provided, including a radar module to generate a transmission signal of at least 60 GHz; and an antenna coupled to the module and to transmit the signal to a surface of the medium and to receive a reflected signal, the module including a phase-locked loop including a push-push oscillator and a phase detector, the oscillator including a first and second outputs, a duplexer coupled between the push-push oscillator and the antenna, and a frequency multiplier coupled between the oscillator second output and the duplexer, the oscillator first output being directly wired to the phase detector input, the duplexer being coupled to the antenna, the phase detector including a reference input and a phase detector output coupled to an oscillator control input. A method for operating a radar fill level measurement device is also provided.

15 Claims, 4 Drawing Sheets

(51) Int. Cl.
*G01S 7/35* (2006.01)
*H03L 7/08* (2006.01)
*G01S 7/03* (2006.01)
*H03L 7/099* (2006.01)

(56) References Cited

U.S. PATENT DOCUMENTS

| | | |
|---|---|---|
| 8,981,861 B2 * | 3/2015 | Zhang .................. H03L 7/24 331/114 |
| 2002/0065631 A1 | 5/2002 | Loechner |
| 2004/0131428 A1 | 7/2004 | Henderson |
| 2004/0184517 A1 | 9/2004 | Westfield et al. |
| 2004/0203421 A1 | 10/2004 | Hedtke |
| 2004/0218326 A1 | 11/2004 | Duren et al. |
| 2005/0289276 A1 | 12/2005 | Karschnia et al. |
| 2018/0031687 A1 | 2/2018 | Mueller et al. |

FOREIGN PATENT DOCUMENTS

| | | |
|---|---|---|
| WO | WO 2005/086331 A2 | 9/2005 |
| WO | WO 2009/003148 A1 | 12/2008 |

OTHER PUBLICATIONS

Decision to Grant dated Feb. 26, 2018, in German Patent Application No. 10 2017 207 783.2, citing document AW therein and indicating the relevance of document AW (18 pages).

Matthias Schott, Dissertation "Methoden zur Phasenrauschverbesserung von monolithischen Millimeterwellen-Oszillatoren", Dipl.-Ing. Von der Fakultät IV—Elektrotechnik and Informatik—der Technischen Universität Berlin zur Erlangung des akademischen Grades, 2008, 126 pages (with English abstract).

* cited by examiner

RADAR FILL LEVEL MEASUREMENT DEVICE COMPRISING A PHASE-LOCKED LOOP

CROSS-REFERENCE TO RELATED APPLICATION

This application claims the benefit of the filing date of German Patent Application No. 10 2017 207 783.2, filed on 9 May 2017, the entire content of which is incorporated herein by reference.

FIELD

The invention generally relates to the field of radar-based fill level measurement. In particular, the invention relates to a radar fill level measurement device comprising a phase-locked loop for determining a fill level of a medium, to the use of a radar fill level measurement device of this type for determining a fill level of a medium, and to a method for operating a radar fill level measurement device of this type.

TECHNICAL BACKGROUND

Radar-based fill level measurement devices and/or radar fill level measurement devices typically comprise a radar module for generating a transmission signal, in particular a high-frequency radar transmission signal.

Generally, in radar fill level measurement devices, the transmission signal is emitted to a surface of a medium, whereupon part of the transmission signal is reflected from the surface and is received in turn by the radar fill level measurement device as a received signal. On the basis of a running time method, the distance of the radar fill level measurement device from the surface of the medium and/or the fill level of the medium can thus be detected.

In this case, the transmission signal may be transmitted during a measurement cycle as a continuous-wave signal, for example, to the surface of the medium. Fill level measurement devices of this type are frequently referred to as continuous-wave (CW) radar fill level measurement devices or as continuous-wave fill level measurement devices. The frequency of the transmission signal can also be boosted during a measurement cycle in a stepped manner, radar fill level measurement devices of this type often being referred to as SFCW ("stepped-frequency continuous-wave") fill level measurement devices. Furthermore, the frequency of the transmission signal is often boosted during a measurement cycle continuously and linearly. Radar fill level measurement devices of this type are generally referred to as FMCW ("frequency-modulated continuous-wave") fill level measurement devices.

In order to produce the radar fill level measurement devices mentioned above, in particular in order to produce the corresponding radar modules of these radar fill level measurement devices, complex electronic circuits may occasionally be necessary.

SUMMARY

The present disclosure describes providing au improved radar fill level measurement device that can be characterised in particular by a simplified design and simultaneously by high robustness and reliability.

The described embodiments, together with further advantages, will be best understood by reference to the following detailed description taken in conjunction with the accompanying drawings.

A described embodiment relates to a radar fill level measurement device for determining and/or detecting the fill level of a medium and/or a radar-based fill level measurement device for determining and/or detecting the fill level of a medium. The radar fill level measurement device comprises a radar module for generating a transmission signal, in particular a radar transmission signal, having a transmission frequency of at least 60 GHz. In other words, the transmission signal may be a high-frequency transmission signal having a frequency or transmission frequency of at least 60 GHz. Furthermore, the radar module comprises at least one antenna, such as a horn antenna and/or a parabolic antenna, which is coupled to the radar module, for sending out the transmission signal to a surface of a medium and for receiving a received signal reflected from the surface, in particular a radar received signal. The radar module comprises a phase-locked loop. The phase-locked loop comprises, in turn, a push-push oscillator and a phase detector, the push-push oscillator comprising a first output for transmitting a first output signal, and a second output for outputting a second output signal. The radar module further comprises a duplexer, coupled between the push-push oscillator and the antenna, for separating the transmission signal and the received signal. The radar module further comprises a frequency multiplier, coupled between the second output of the push-push oscillator and the duplexer, for multiplying the frequency of the second output signal of the push-push oscillator, the first output of the push-push oscillator being directly wired, connected and/or coupled to an input of the phase detector. In this case, the duplexer is coupled to the antenna so that the transmission signal can be emitted via the antenna on the basis of the second output signal of the push-push oscillator. The phase detector comprises a reference input for receiving reference frequency signals, and a phase detector output, which is coupled to a control input of the push-push oscillator. The phase detector is configured and/or configured to detect a phase difference between the reference frequency signal and the second output signal of the push-push oscillator, and to transmit, at the phase detector output, a regulation signal for regulating the push-push oscillator, which regulation signal correlates with the detected phase difference, to the control input of the push-push oscillator. By regulating the push-push oscillator using the regulation signal, for example, a frequency of the first output signal and/or a frequency of the second output signal can be regulated. By regulating the push-push oscillator, the transmission frequency of the transmission signal can also be regulated.

The phase-locked loop, also called a PLL, may refer to a "closed feedback loop", by means of which the output frequency of the first and/or second output signal of the push-push oscillator, and therefore the transmission frequency of the transmission signal, can be regulated during a measurement cycle. For this purpose, a phase difference between the first output signal and the reference frequency signal can be detected and/or determined by the phase detector, which is often referred to as a phase comparator and/or as a phase comparing element. If a phase difference of this type is detected by the phase detector, said detector can transmit the regulation signal to the control input of the oscillator in order to regulate the output frequency of the first and/or second output signal and therefore to regulate the transmission frequency of the transmission signal, for example to a predetermined desired value or a desired frequency. The phase detector can also be used to detect a deviation of the output frequency of the first and/or second output signal from the desired value and to compensate for said deviation by means of the regulation signal. Therefore, the transmission frequency can be reliably regulated in an advantageous manner.

The medium may generally be a liquid and/or a fluid in a container. Alternatively or additionally, the medium may be a bulk material in a container and/or in a storage facility, such as a bulk material pile. Furthermore, the medium may also refer to a fluid medium, such as a channel, and the radar fill level measurement device according to a described embodiment may also be used for measuring said channel.

According to a described embodiment, the first output of the push-push oscillator is in particular directly and/or immediately wired, connected and/or coupled to the input of the phase detector. In other words, the first output of the push-push oscillator may be directly connected to the input of the phase detector, without additional electronic components being coupled and/or arranged therebetween. For example, in known radar fill level measurement devices, a frequency divider for dividing the output frequency of the first output signal of the oscillator is typically coupled between the first output of the oscillator and the input of the phase detector. A frequency divider of this type is dispensed with in the radar fill level measurement device according to a described embodiment. Eliminating the frequency divider can advantageously reduce circuit complexity. Additionally, installation space can be saved and/or the size of the radar module can be reduced. In other words, the design of the radar fill level measurement device can be simplified, so that the entire radar fill level measurement device can be compact without any loss of function. The simplified and compact design of the radar fill level measurement device and/or of the radar module may be advantageous in particular if the radar module is arranged in an integrated radar chip, such as a high-frequency chip and/or a microwave chip.

Oscillators configured as fundamental wave oscillators are widespread in the field of radar technology. An oscillator of this kind may have, for example, an amplification unit and a resonator, in particular a high-quality resonator. Moreover, it may be possible to vary the frequency of the resonator by means of at least one varactor diode. Oscillators of this type are also referred to as voltage-controlled oscillators (VCO). The term "fundamental wave oscillator" can therefore refer, within the meaning of the present disclosure, to an oscillator that oscillates at the resonant frequency of the relevant resonator of the oscillator, it being possible for the output signal having the resonant frequency to be picked off at least one output. The "fundamental frequency" of the oscillator may also refer to the resonant frequency of the relevant resonator of the oscillator.

In contrast, the push-push oscillator used according to a described embodiment differs greatly from a fundamental wave oscillator described above. In general, push-push oscillators may be configured as differential oscillators. In addition, push-push oscillators may be configured such that the frequency thereof can be controlled and/or regulated by means of at least one varactor diode. Push-push oscillators often consist of at least two sub-oscillators, the respective output signals of which may be a frequency comb. The output signals of the sub-oscillators may be combined via a coupler, for example, it being possible that the output signals of the sub-oscillators are phase-shifted by approximately 180° with respect to one another, such that the odd multiples of the output signals of the sub-oscillators can interfere destructively and can be erased in the process. In contrast, the even multiples of the output signals of the sub-oscillators can interfere constructively, and therefore harmonic waves can be produced. Due to its construction, a push-push oscillator can therefore also generate even-numbered multiples and/or harmonics, in addition to the fundamental wave of the oscillator, which multiples and/or harmonics can be picked off as an output signal of the push-push oscillator. In this case, the harmonics are typically picked off and/or transmitted at a high-frequency output of the push-push oscillator. Here and in the following, the above-described second output of the push-push oscillator can be a high-frequency output of this type. Here and in the following, the above-described first output of the push-push oscillator can, in contrast, be a low-frequency output of the push-push oscillator, at which output a fundamental frequency of the push-push oscillator can be coupled out. According to a described embodiment, one of the harmonics of the push-push oscillator may therefore be picked off at the high-frequency output and/or the second output and supplied to the frequency multiplier. Furthermore, the low-frequency first output signal, for example at the fundamental frequency of the push-push oscillator, can be picked off at the first output and supplied directly to the phase detector, and so a frequency divider between the oscillator and the phase detector can be dispensed with. Furthermore, the size of a push-push oscillator may be reduced in relation to conventional oscillators, such that the size of the radar module can be further reduced by using the push-push oscillator. Overall, as a result of the design of the radar module according to a described embodiment, the push-push oscillator can be operated in a relatively low-frequency range.

According to an embodiment, the first output signal from the push-push oscillator has a fundamental frequency of the push-push oscillator. Alternatively or additionally, the second output signal from the push-push oscillator has the frequency of a first harmonic of the push-push oscillator. In this case, the frequency of the first harmonic can be approximately double that of the fundamental frequency. Overall, in this way, owing to the design of the radar module according to a described embodiment, the push-push oscillator can be operated in a relatively low-frequency range, it nonetheless being possible for the transmission signal to have a transmission frequency of at least 60 GHz, since the second output signal already has double the fundamental frequency of the push-push oscillator and the frequency of said second output signal also still being additionally multiplied by the frequency multiplier.

According to an embodiment, the frequency multiplier is configured to boost the frequency of the second output signal by at least a factor of 4, for example at least a factor of 6, and in particular at least a factor of 8. Overall, as a result, the push-push oscillator can be operated in a relatively low-frequency range. A fundamental frequency of the push-push oscillator can be approximately 5 GHz, for example. This fundamental frequency may be picked off in the form of the first output signal at the first output of the push-push oscillator and be directly supplied to the phase detector. The phase detector can reliably process low frequencies of this type. By contrast, the doubled fundamental frequency can be picked off as the second output signal at the second output of the push-push oscillator and can be supplied to the frequency multiplier. The frequency of this second output signal can then be boosted by at least a factor of 4, by a factor of 6, for example, and in particular by a factor of 8; i.e., to at least 80 GHz. The transmission frequency of the transmission signal can thus in turn be at least 80 GHz.

According to an embodiment, the radar module is configured as a V-band radar module, an E-band radar module, a W-band radar module, an F-band radar module, a D-band radar module, a G-band radar module, a Y-band radar module and/or a J-band radar module. In other words, the transmission frequency of the transmission signal may be between 60 GHz and 75 GHz (V-band), between 60 GHz and 90 GHz (E-band), between 75 GHz and 110 GHz (W-band), between 90 GHz and 140 GHz (F-band), between 110 GHz and 170 GHz (D-band), between 140 GHz and 220 GHz (G-band), between 170 GHz and 260 GHz (Y-band), and/or between 220 GHz and 320 GHz (J-band).

According to an embodiment, the phase-locked loop further comprises a loop filter, coupled between the phase detector output of the phase detector and the control input of the push-push oscillator, for filtering the regulation signal of the phase detector. For example, the regulation signal transmitted by the phase detector at the phase detector output may be a pulse packet that correlates with the detected phase difference and can be converted into a filtered regulation signal using the loop filter, which regulating signal can be processed by the push-push oscillator in order to regulate the output frequency of the push-push oscillator.

According to an embodiment, the radar fill level measurement device and/or the radar module further comprises a frequency mixer, coupled to the duplexer, for generating an intermediate frequency signal on the basis of the transmission signal and on the basis of the received signal. The intermediate frequency signal may refer to a differential signal, i.e., the intermediate frequency signal may have a frequency that can substantially correspond to the difference between the frequencies of the transmission signal and of the received signal. The intermediate frequency signal may therefore refer to a low-frequency signal that can be processed and/or evaluated by additional components of the radar fill level measurement device in order to determine the fill level. In other words, the received signal and the undelayed transmission signal can be mixed down into the intermediate frequency range in the frequency mixer and distance information with regard to the distance between the radar fill level measurement device and the surface can then be detected from this intermediate frequency signal, in particular on the basis of a Fourier transform of the intermediate frequency signal and/or on the basis of a frequency determination.

According to an embodiment, the radar fill level measurement device further comprises a digital control unit for controlling the phase-locked loop and/or for controlling the phase detector using digital control signals. The control unit may be configured as a digital signal processor (DSP) and/or as a microcontroller, for example. In general, the control unit may refer to a logic means of the radar fill level measurement device. Depending on the actuation of the phase-locked loop using the digital control signals, a linear, continuous frequency ramp (frequency-modulated continuous-wave ("FMCW")), a stepped frequency ramp (stepped-frequency continuous-wave ("SFCW")) or a continuous-wave signal ("CW signal") can be generated during a measurement cycle by means of the radar module.

According to an embodiment, the digital control unit is configured to actuate the phase-locked loop in such a way that the transmission signal passes through a continuous linear frequency ramp during a measurement cycle. Alternatively or additionally, the radar fill level measurement device is configured as a frequency-modulated continuous-wave (FMCW) radar. In the case of the continuous linear frequency ramp, the frequency of the transmission signal is continuously and linearly boosted from a fundamental frequency to a maximum frequency during a measurement cycle and is then lowered back to the fundamental frequency, such that the distance of the radar fill level measurement device from the surface of the medium, and therefore the fill level, can be reliably detected. Alternatively or additionally, the digital control unit is configured to actuate the phase-locked loop in such a way that the transmission signal passes through a stepped frequency ramp during a measurement cycle. In other words, the radar fill level measurement device may be configured as an SFCW radar, it being possible to boost, in a stepped manner over a plurality of steps, the frequency of the transmission signal from a fundamental frequency to the maximum frequency during a measurement cycle and to then lower said frequency again.

According to an embodiment, the digital control unit is furthermore configured to detect the distance from the surface of the medium and/or the fill level of the medium, on the basis of an intermediate frequency signal transmitted from a frequency mixer of the radar fill level measurement device. For example, the control unit may be configured to decompose a measurement signal that correlates with the intermediate frequency signal and that can be provided by an analogue-digital converter, for example, into frequency components and to evaluate said measurement signal, within the context of a Fourier analysis, in particular a fast Fourier transform (FTT). On the basis of this frequency determination, distance information with regard to the distance of the radar fill level measurement device from the surface of the medium and/or the fill level of the medium can then be detected.

According to an embodiment, the radar fill level measurement device and/or the radar module further comprises an amplifier for amplifying an intermediate frequency signal that is transmitted by a frequency mixer of the radar fill level measurement device. Alternatively or additionally, the radar module and/or the radar fill level measurement device comprises a filter, which is coupled between a digital control unit and a frequency mixer of the radar fill level measurement device. The filter may be a high-pass filter or a low-pass filter. Alternatively or additionally, the radar module and/or the radar fill level measurement device comprises an analogue-digital converter, which is coupled between a digital control unit and a frequency mixer of the radar fill level measurement device, the analogue-digital converter being configured to generate a digital measurement signal that correlates with an intermediate frequency signal transmitted by the frequency mixer.

According to an embodiment, the radar fill level measurement device and/or the radar module further comprises a reference oscillator, which is coupled to the reference input of the phase detector and which is configured to generate reference frequency signals. In this case, the reference oscillator may be configured as a crystal oscillator, for example, which can generate and/or provide reference frequency signals that are stable in frequency.

According to an embodiment, the radar fill level measurement device and/or the radar module further comprises an amplifier, coupled to the second output of the push-push oscillator, for amplifying the second output signal of the push-push oscillator. The amplifier may be integrated in the duplexer, for example.

Another described embodiment relates to the use of a radar fill level measurement device, as described above and in the following, for determining the fill level of a medium.

A further described embodiment relates to a method for operating a radar fill level measurement device as described above and in the following. The method according to the described embodiment may also refer to a method for detecting the fill level of a medium by using a radar fill level measurement device as described above and in the following. The method comprises the following steps:

generating, by means of the radar module of the radar fill level measurement device, a transmission signal, which has a frequency or a transmission frequency of at least 60 GHz;

emitting, by means of the at least one antenna of the radar fill level measurement device, the transmission signal towards a surface of a medium;

receiving, by means of the at least one antenna of the radar fill level measurement device, a received signal reflected from the surface of the medium;

mixing, by means of a frequency mixer of the radar fill level measurement device, the transmission signal with the received signal in order to generate an intermediate frequency signal;

evaluating, by means of a digital control unit of the radar fill level measurement device, a digital measurement signal that correlates with the intermediate frequency signal in order to detect the distance of the radar fill level measurement device from the surface of the medium and/or in order to detect a fill level of the medium.

Features and/or elements of the radar fill level measurement device, as described above and in the following, may be features, elements and/or steps of the method, as described above and in the following. Features, elements and/or steps of the method, as described above and in the following, may also be features and/or elements of the radar fill level measurement device, as described above and in the following.

Embodiments are described in the following with reference to the drawings. In the drawings, like reference signs denote like or similar elements or elements having the same effect.

BRIEF DESCRIPTION OF THE DRAWINGS

In the following description, embodiments are explained in greater detail with reference to the drawings, in which.

The views in the drawings are merely schematic and not to scale.

DETAILED DESCRIPTION OF EMBODIMENTS

Figure 1:
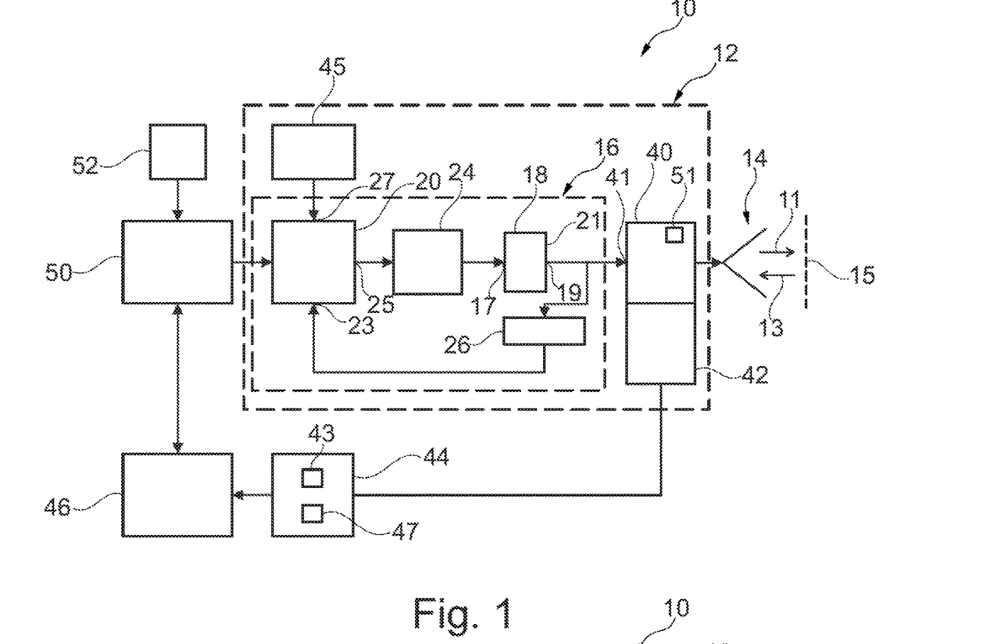
FIG. 1 is a block diagram of a radar fill level measurement device according to an embodiment.

FIG. 1 is a block diagram of a radar fill level measurement device 10 according to an embodiment.

The radar fill level measurement device 10 comprises a radar module 12 for generating a transmission signal 11 and an antenna 14 that is coupled to the radar module 12. The transmission signal 11 can be emitted and/or sent out via the antenna 12 towards a surface 15 of the medium and a received signal 13 reflected from the surface 15 can be received by the antenna 14. The antenna 12 may be any type of antenna 12, such as a horn antenna, a lens antenna or a parabolic antenna. In this case, the transmission signal 11 has a transmission frequency of at least 60 GHz.

The radar module 12 comprises a phase-locked loop 16, which comprises an oscillator 18 and a phase detector 20 that is coupled to the oscillator 18. The phase detector 20 may be a fractional phase detector 20, also called frac-N PLL, and/or an integer phase detector 20, also called int-N PLL. Furthermore, the phase-locked loop 16 comprises a frequency divider 26, which is coupled between an output 19 of the oscillator 18 and an input 23 of the phase detector 20. Furthermore, the phase-locked loop 16 comprises a loop filter 24, which is coupled between a phase detector output 25 of the phase detector 20 and a control input 17 of the oscillator 18.

The oscillator 18 is a frequency-controlled oscillator 18 (VCO), which is configured as a fundamental wave oscillator 18 or a voltage-controlled fundamental wave oscillator 18. The oscillator 18 transmits, at the output 19 that is directly connected to the input 41 of the duplexer 40, an output signal having a fundamental frequency of the oscillator 18. In other words, an output frequency of the output signal transmitted at the output 19 of the oscillator 18 may correspond to the fundamental frequency of the oscillator 18. The oscillator 18 may also comprise an additional output 21, for example a high-frequency output 21, which is not coupled to additional components of the radar module 12 and therefore at which no signal is picked off.

Furthermore, the radar module 12 comprises a reference oscillator 45, which is coupled to the reference input 27 of the phase detector 20. Furthermore, the radar module 12 comprises a duplexer 40 that is coupled between the oscillator 18 and the antenna 14 and is configured to divide the transmission signal 11 and the received signal 13, which is temporally delayed relative to the transmission signal 11. In this case, the output 19 of the oscillator 18 is directly and/or immediately connected, wired and/or coupled to an input 41 of the duplexer. In other words, there is no additional component, such as a frequency multiplier, provided in the electrical connection between the output 19 of the oscillator 18 and the input 41 of the duplexer 40. This can advantageously reduce power consumption, size and/or circuit complexity of the radar fill level measurement device 10. In addition, phase noise of the oscillator 18 is advantageously not multiplied as a result of dispensing with an additional component such as a frequency multiplier. The oscillator 18 may be based on silicon-germanium technology (SiGe), for example, and therefore the oscillator 18 may be configured as a fundamental wave oscillator 18 even in the mm wave range. This significantly reduces the circuit complexity for the transmission branch of the radar fill level measurement device 10, and a frequency multiplier can be completely dispensed with. This also significantly reduces the energy consumption of the entire transmission branch. In addition, the frequency divider 26, which may be a prescaler 26, for example, can be configured in a relatively simple manner and so as to have lower power consumption than a frequency multiplier.

The radar fill level measurement device 10 and/or the radar module 12 further comprises a frequency mixer 42, which is coupled to the duplexer 40 and which generates an intermediate frequency signal based on the transmission signal 11 and the received signal 13, which intermediate frequency signal has a frequency corresponding to a difference between the transmission frequency of the transmission signal 11 and a frequency of the received signal 13.

The frequency mixer 42 is furthermore connected and/or coupled to an electronic arrangement 44. The electronics arrangement 44 comprises a filter 43, for example a high-pass filter 43 or a low-pass filter 43, for filtering the intermediate frequency signal, and an amplifier 47 for amplifying the filtered intermediate frequency signal.

By means of an analogue-digital converter 46 of the radar fill level measurement device 10, the filtered and amplified intermediate frequency signal is converted into a digital measurement signal and is supplied to a digital control unit 50 of the radar fill level measurement device 10 for the actual detection of the fill level of the medium. The digital control unit may be configured, for example, as a digital signal processor (DSP) and/or as a microcontroller. The digital control unit 50 may, for example, decompose the digital measurement signal into frequency components on the basis of a Fourier transform, in particular a fast Fourier transform, and detect the distance between the radar fill level measurement device 10 and the surface 15 of the medium, and/or a fill level of the medium, on the basis of an evaluation of the frequency components. For this purpose, the control unit 50 is furthermore coupled to a crystal oscillator 52 as a clock generator.

The transmission frequency of the transmission signal 11 can be regulated during a measurement cycle by the phase-locked loop 16, and/or additional components of the radar module 12, as described in the following. The oscillator 18 generates an output signal and transmits said signal at the output 19. The output signal may have an output frequency of at least 60 GHz, for example. The output signal is supplied to the frequency divider 26, which frequency divider generates a frequency-divided signal, i.e., a signal having a frequency that is reduced in relation to the output signal. This may be necessary, as the phase detector 20 cannot process excessively high frequencies in some cases. The frequency-divided signal is then supplied to the phase detector via the input 23 of the phase detector 20. Furthermore, the phase detector 20 receives, at the reference input 27, a reference frequency signal from the reference oscillator 45. The control unit 50 applies digital control signals to the phase detector 20, by means of which signals the phase detector 20 is controlled and/or regulated. The phase detector 20 then detects a phase difference and/or a phase change between the reference frequency signal and the frequency-divided signal. Depending on the actuation of the phase detector 20 by the digital control signals of the control unit and depending on the detected phase difference, the phase detector 20 generates a regulation signal that correlates with the detected phase difference, and transmits said signal at the phase detector output 25. The regulation signal may be a pulse packet, for example. The regulation signal is then supplied to the loop filter 24, which generates a filtered regulation signal and transmits said signal to the control input 17 of the oscillator 18. Depending on the regulation signal, the frequency of the fundamental mode of the oscillator 18 can be varied, for example by means of a varactor diode of the oscillator 18, and correspondingly, the output frequency of the output signal of the oscillator 18 and the transmission frequency of the transmission signal 11 can be varied. Depending on the actuation of the phase-locked loop 20 by the digital control signals of the control unit 50, a linear, continuous frequency ramp ("frequency-modulated continuous-wave, FMCW"), a stepped frequency ramp ("stepped-frequency continuous-wave") or a continuous-wave signal ("CW signal") can be generated by means of the radar module 12 during a measurement cycle.

The output signal transmitted by the oscillator 18 at the output 19 thereof is then supplied to the duplexer 40. Furthermore, an amplifier 51 for amplifying the output signal of the oscillator 18 may be integrated in the duplexer. The optionally amplified output signal is coupled into the antenna 14 and emitted as a transmission signal 11.

As already explained above, the transmission signal 11 and the received signal 13 reflected from the surface 15 of the medium are supplied to the frequency mixer 42, which generates the intermediate frequency signal. The intermediate frequency signal is filtered by the filter 43, amplified by the amplifier 47 and converted into the digital measurement signal by the analogue-digital converter 46, which measurement signal is evaluated by the control unit 50 in order to detect the fill level. If the radar fill level measurement device 10 is configured as an SFCW measuring device, the filter 43 may be a low-pass filter 43. If the radar fill level measurement device 10 is configured as an FMCW measuring device, the filter 43 may be a high-pass filter 43.

Figure 2:
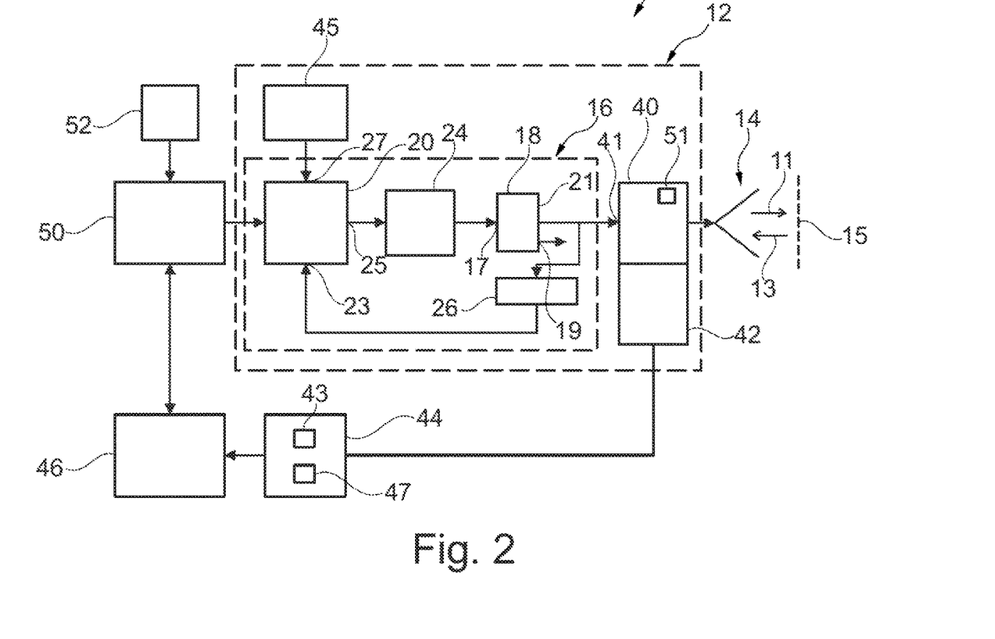
FIG. 2 is a block diagram of a radar fill level measurement device according to embodiment.

FIG. 2 is a block diagram of a radar fill level measurement device 10 according to an embodiment. Unless otherwise stated, the radar fill level measurement device 10 in FIG. 2 comprises the same elements, components and/or functions as the radar fill level measurement device 10 in FIG. 1.

In particular, the radar fill level measurement device 10 in FIG. 2 differs from the radar fill level measurement device 10 in FIG. 1 only with regard to the oscillator 18. Apart from the oscillator 18, all of the disclosures with regard to the radar fill level measurement device 10 in FIG. 1 therefore also apply to the radar fill level measurement device 10 in FIG. 2. This disclosure in FIG. 1 is therefore included here by way of reference, in order to avoid repetition.

In contrast to the oscillator 18 in FIG. 1, the oscillator 18 in FIG. 2 is a push-push oscillator 18. In this case, an output 21 of the push-push oscillator 18 is directly coupled, connected and/or wired to the input 41 of the duplexer 40. This output 21 is a high-frequency output 21, and an additional output 19 of the push-push oscillator 18, which may be a low-frequency output 19, for example, is not connected to additional components of the radar level measurement device 10.

The push-push oscillator 18 transmits, at the output 21 of the push-push oscillator 18 that is directly connected to the input 41 of the duplexer, a first harmonic as an output signal. The output frequency of the output signal can therefore correspond to approximately double the frequency of a fundamental frequency of the oscillator 18. Analogously to the illustrations in FIG. 1, the frequency of the fundamental frequency, and therefore also of the frequency of the harmonic and/or the output frequency of the oscillator 18, can be varied by means of the filtered regulation signal, which is generated by means of the frequency divider 26, the phase detector 20, the control unit 50 and/or the loop filter 24, for example by correspondingly actuating a varactor diode of the oscillator 18. Therefore, the transmission frequency of the transmission signal 11 is also varied analogously to the illustrations in FIG. 1.

If, as explained above, the first harmonic at the output 21 of the push-push oscillator 18 is decoupled in a targeted manner, the fundamental frequency $f_0$ of the push-push oscillator 18 may be 40 GHz, for example, and the transmission frequency of the radar fill level measurement device 10 may be 80 GHz, for example.

In comparison with other oscillators 18, such as fundamental wave oscillators, using a push-push oscillator 18 can have further advantages. If the push-push oscillator 18 is used, a larger tuning bandwidth of the output signal, approximately double the bandwidth as in the case of the fundamental frequency $f_0$, can be achieved, for example, compared to using a fundamental wave oscillator at 80 GHz. The phase noise in the case of a push-push oscillator 18 operated at 40 GHz may also be significantly better than in the case of an 80 GHz fundamental wave oscillator.

It should farther be noted that in the embodiment in FIG. 2, the frequency divider 26 could also be connected to the low-frequency output 19 of the oscillator 18 and therefore could be configured in a simpler manner. However, as a result of connecting the frequency divider 26 to the high-frequency output 21, all the influences of the phase noise in the oscillator 18 are taken into consideration in the phase-locked loop 16, and therefore somewhat better measurement results can be achieved than if the frequency divider 26 were connected to the low-frequency output 19.

Figure 3:
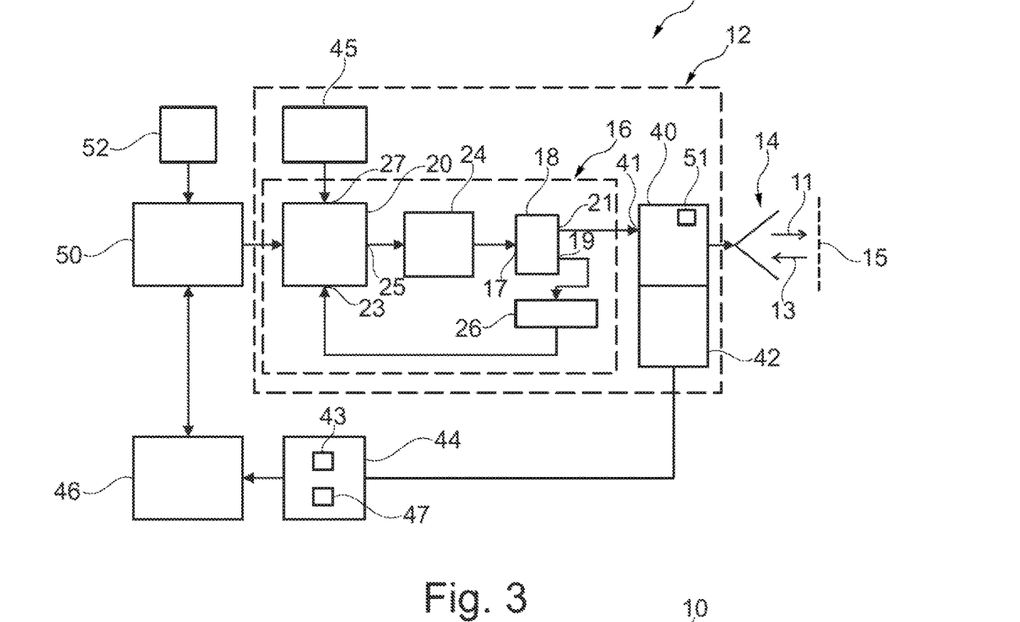
FIG. 3 is a block diagram of a radar fill level measurement device according to an embodiment.

FIG. 3 is a block diagram of a radar fill level measurement device 10 according to an embodiment. Unless otherwise stated, the radar fill level measurement device 10 in FIG. 3 comprises the same elements, components and/or functions as the radar fill level measurement devices 10 in FIGS. 1 and 2.

In particular, the radar fill level measurement device 10 in FIG. 3 differs from the radar fill level measurement device 10 in FIG. 1 only with regard to the oscillator 18. Apart from the oscillator 18, all of the disclosures with regard to the radar fill level measurement device 10 in FIG. 1 therefore also apply to the radar fill level measurement device 10 in FIG. 3. This disclosure in FIG. 1 is therefore included here by way of reference, in order to avoid repetition.

Furthermore, in the embodiment shown in FIG. 3, only the wiring of the oscillator 18 differs in relation to the wiring of the oscillator 18 in FIG. 2, i.e., the oscillator 18 in FIG. 3 is also a push-push oscillator 18, as shown in FIG. 2. In particular, in the embodiment shown in FIG. 3, the high-frequency output 21 of the oscillator 18 is directly connected, as illustrated in FIG. 2, to the input 41 of the duplexer 40, and therefore the first harmonic having the doubled fundamental frequency $f_0$ is transmitted to the input 41 of the duplexer 40. In contrast to FIG. 2, however, the output 19 of the push-push oscillator 18, i.e., the low-frequency output 19, is coupled to the frequency divider 26, and therefore an output signal having the fundamental frequency $f_0$ of the oscillator 18 is supplied to the frequency divider 26. The frequency divider 26 can therefore be configured in a simplified manner in comparison with the frequency divider 26 in FIG. 2. However, apart from the oscillator 18 being wired to the outputs 19, 21, all of the disclosures in FIG. 2 with regard to the oscillator 18 shown therein also apply to FIG. 3 and are included here by way of reference.

Figure 4:
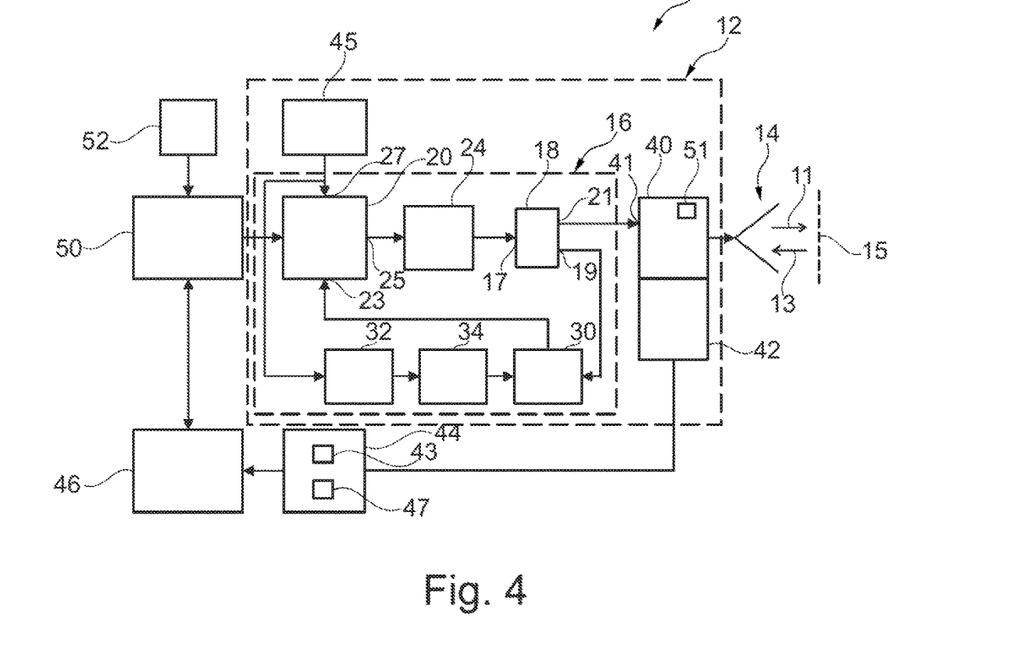
FIG. 4 is a block diagram of a radar fill level measurement device according to an embodiment.

FIG. 4 is a block diagram of a radar fill level measurement device 10 according to an embodiment. Unless otherwise stated, the radar fill level measurement device 10 in FIG. 4 comprises the same elements, components and/or functions as the radar fill level measurement devices 10 in FIGS. 1 to 3.

In particular, the radar fill level measurement device 10 in FIG. 4 differs from the radar fill level devices 10 in FIGS. 1 to 3 only with regard to the feedback branch of the phase-locked loop 16 between the oscillator 18 and the phase detector 20. All of the other disclosures of FIGS. 1 to 3 are therefore included here by way of reference.

An additional frequency mixer 30 is installed in the feedback branch of the phase-locked loop 16 in FIG. 4, instead of the frequency divider 26 in FIGS. 1 to 3. This additional frequency mixer 30 is coupled to the low-frequency output 19 of the oscillator 18. The high-frequency output 21 of the oscillator 18 is furthermore directly connected to the input 41 of the duplexer 40. The oscillator 18 in FIG. 4 is furthermore a push-push oscillator 18, as shown in FIGS. 2 and 3, the oscillator 18 in FIG. 4 being wired as shown in FIG. 3.

In contrast to the radar fill level devices 10 in FIGS. 1 to 3, the feedback branch of the phase-locked loop 16 further comprises an additional phase detector 32 and an additional oscillator 34. The additional phase detector 32 may be an integer phase detector 32 (int-N PLL), for example, and the additional oscillator 34 may be a VCO, a fundamental wave oscillator or a push-push oscillator. However, the phase detector 20 may be a fractional phase detector (fract-N PLL) and/or an integer phase detector (int-N PLL).

In order to regulate the fundamental frequency, the output frequency, transmitted at the high-frequency output 21, of the output signal of the oscillator 18, and/or in order to regulate the transmission frequency of the transmission signal 11, the reference frequency signal of the reference oscillator 45 is applied both to the reference input 27 of the phase detector 20 and to an input of the additional phase detector 32. The additional phase detector 32 then transmits a control signal to the additional oscillator 34 and thereby controls or regulates an output frequency of an additional output signal transmitted from the additional oscillator 34. This additional output signal is supplied to the additional frequency mixer 30. The output signal transmitted at the low-frequency output 19 of the oscillator 18, which signal has the fundamental frequency $f_0$ of the oscillator 18, is also supplied to the additional frequency mixer 30. The additional frequency mixer 30 then downmixes the output signal transmitted at the output 19 on the basis of the additional output signal of the additional oscillator 34, for example by calculating the difference, and transmits an additional intermediate frequency signal to the input 23 of the phase detector 20. The phase detector 20 then detects, analogously to the embodiments in FIG. 1, a phase difference between the additional intermediate frequency signal and the reference frequency signal of the reference oscillator 45 and transmits a regulation signal that correlates with the phase difference to the loop filter 24 and/or to the oscillator 18, so that the transmission frequency of the transmission signal 11 is regulated. Relatively good phase noise can be achieved using the embodiment of the radar fill level measurement device 10 in FIG. 4.

Figure 5:
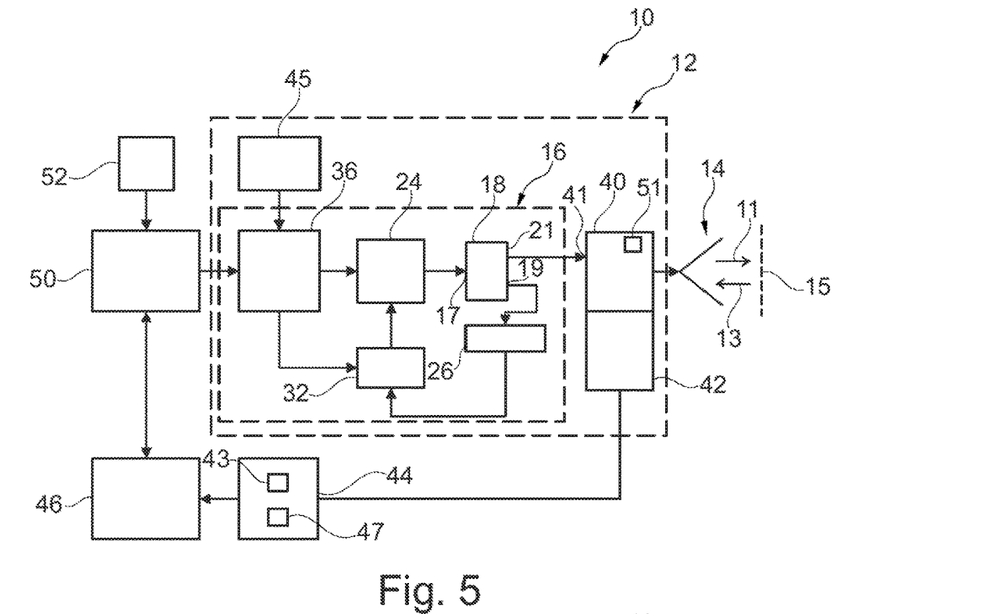
FIG. 5 is a block diagram of a radar fill level measurement device according to an embodiment.

FIG. 5 is a block diagram of a radar fill level measurement device 10 according to an embodiment. Unless otherwise stated, the radar fill level measurement device 10 in FIG. 5 comprises the same elements, components and/or functions as the radar fill level measurement devices 10 in FIGS. 1 to 4.

In particular, the radar fill level measurement device 10 in FIG. 5 differs from the radar fill level devices 10 in FIGS. 1 to 4 only with regard to the feedback branch of the phase-locked loop 16 between the oscillator 18 and the phase detector 20. All of the other disclosures of FIGS. 1 to 4 are therefore included here by way of reference.

The radar fill level measurement device 10 in FIG. 5 comprises a direct digital synthesizer (DDS) 36 in the feedback branch of the phase-locked loop 16, instead of the phase detector 20 in the preceding drawings. In addition, a phase detector 32, for example an integer phase detector 32 (int-N PLL), is arranged in the feedback branch.

The oscillator 18 in FIG. 5 is a push-push oscillator 18, the first harmonic at the high-frequency output 21 being supplied to the input 41 of the duplexer 40. By contrast, the low-frequency output 19 of the oscillator 18 is coupled to the frequency divider 26. The oscillator 18 in FIG. 5 is therefore wired analogously to the oscillators 18 in FIGS. 3 and 4.

The low-frequency output signal of the oscillator 18, which signal has the fundamental frequency of the oscillator 18, is frequency-divided by the frequency divider and supplied to the phase detector 32. Furthermore, the digital control signals of the control unit 50 and the reference frequency signals of the reference oscillator 45 are applied to the DDS 36. The DDS 36 then transmits a corresponding signal to the phase detector 32 and the phase detector 32 detects a phase difference between the frequency-divided signal and the signal of the DDS 36. The phase detector 32 in turn transmits a regulation signal that correlates with the phase difference to the loop filter 24 and/or to the control input 17 of the oscillator 18, so that the transmission frequency of the transmission signal 11 is thereby regulated.

Figure 6:
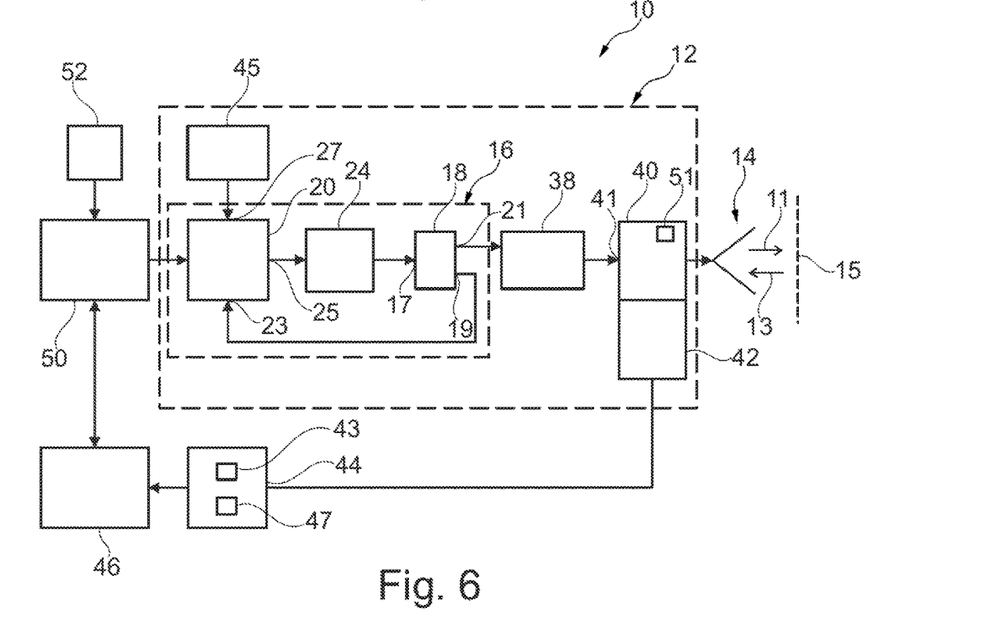
FIG. 6 is a block diagram of a radar fill level measurement device according to an embodiment.

FIG. 6 is a block diagram of a radar fill level measurement device 10 according to embodiment of the invention. Unless otherwise stated, the radar fill level measurement device 10 in FIG. 6 comprises the same elements, components and/or functions as the radar fill level measurement devices 10 in FIGS. 1 to 5.

The embodiment in FIG. 6 substantially corresponds to the embodiment in FIG. 3, with the difference that the oscillator 18, which is a push-push oscillator 18, is operated in the low-frequency range. For example, the oscillator 18 may be operated at a fundamental frequency $f_0$ of approximately 5 GHz. In this case, the low-frequency output 19 of the oscillator 18 is directly and/or immediately connected, coupled and/or wired to the input 23 of the phase detector 20. By operating the oscillator 18 in the low-frequency range, the use of a frequency divider 26, shown in FIG. 3 for example, can be advantageously dispensed with, and the low-frequency output signal of the oscillator 18 can be directly supplied to the phase detector 20. The phase detector 20 in turn detects a phase difference between the low-frequency output signal of the oscillator 18 and the reference frequency signal of the reference oscillator 45 and transmits, at the phase detector output 25, a regulation signal that correlates with the phase difference to the loop filter 24 and/or to the control input 17 of the oscillator 18, such that the transmission frequency of the transmission signal 11 can be regulated. As a result of such a design of the circuit of the radar module 12, a frequency divider 26, such as shown in FIG. 3 for example, can advantageously be dispensed with. Overall, this can reduce the circuit complexity and the size of the radar module 12.

The high-frequency output 21 of the oscillator 18, which can refer to a second output 21 of the oscillator and at which the first harmonic having the doubled fundamental frequency $f_0$ is transmitted as the output signal (as shown in FIG. 3, for example), is also coupled to a frequency multiplier 38. In particular, the frequency multiplier 38 may increase the output signal, transmitted at the high-frequency output 21, of the oscillator 18 by at least a factor of four, for example at least a factor of six and in particular at least a factor of eight. If the oscillator 18 is operated using a fundamental frequency of 5 GHz, a frequency of the second output signal can be about 10 GHz, and a transmission frequency of the transmission signal 11 can be approximately 80 GHz.

It should be emphasised at this point that all of the disclosures of the radar fill level measurement devices 10 disclosed in FIGS. 1 to 5, apart from the differences explained above, also apply to the radar fill level measurement device 10 in FIG. 6 and are therefore included here by way of reference.

Figure 7:
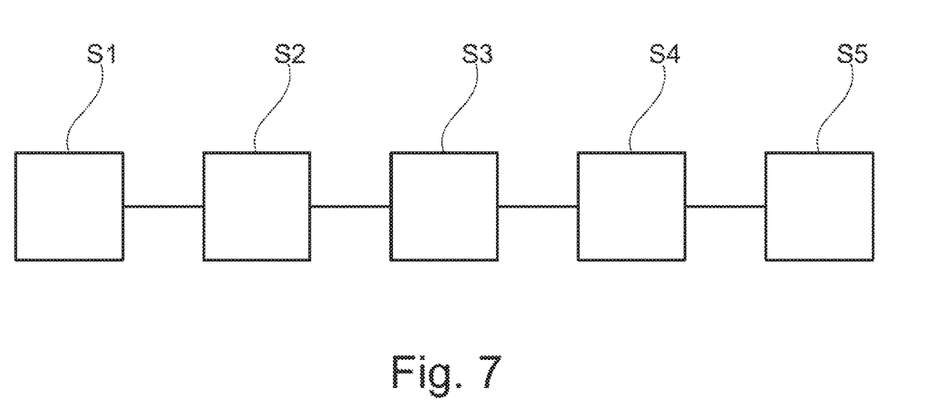
FIG. 7 is a flow diagram to illustrate the steps of a method for operating a radar fill level measurement device according to an embodiment.

FIG. 7 is a flow diagram to illustrate the steps of a method for operating a radar fill level measurement device 10 according to an embodiment. In this case, the radar fill level measurement device 10 may be one of the radar fill level measurement devices 10 in FIGS. 1 to 6.

In a first step S1, a transmission signal 11 is generated by means of the radar module 12 of the radar fill level measurement device 10, which transmission signal has a frequency or a transmission frequency of at least 60 GHz. In a further step S2, the transmission signal 11 is emitted towards the surface 15 of a medium by means of the at least one antenna 14 of the radar fill level measurement device 10. In a further step S3, a received signal 13, which is reflected from the surface 15 of the medium, is received by the at least one antenna 14 of the radar fill level measurement device 10. In a further step S4, the frequency mixer 42 of the radar fill level measurement device 10 mixes the transmission signal 11 with the received signal 13 in order to generate an intermediate frequency signal. In a further step S5, a digital measurement signal that correlates with the intermediate frequency signal is evaluated by a digital control unit 50 of the radar fill level measurement device 10. In this case, the measurement signal can be evaluated in order to detect the distance of the radar fill level measurement device 10 from the surface 15 of the medium and/or in order to detect the fill level of the medium.

In addition, it should be pointed out that "comprising" and "having" do not preclude any other elements or steps and "a" or "an" does not preclude a plurality. Furthermore, it should be pointed out that features or steps that have been described with reference to one of the embodiments above can also be used in combination with other features or steps of other embodiments described above. Reference numerals in the claims should not be considered limiting.

We claim:

1. A radar fill level measurement device for determining the fill level of a medium, the radar fill level measurement device comprising:
   a radar module configured to generate a transmission signal having a transmission frequency of at least 60 GHz; and
   at least one antenna coupled to the radar module and being configured to transmit the transmission signal to a surface of the medium and to receive a signal reflected from the surface,
   wherein the radar module comprises:
   a phase-locked loop comprising a push-push oscillator and a phase detector, wherein the push-push oscillator comprises a first output configured to transmit a first output signal, and a second output configured to transmit a second output signal,
   a duplexer coupled between the push-push oscillator and the at least one antenna, configured to separate the transmission signal and the received signal, and
   a frequency multiplier coupled between the second output of the push-push oscillator and the duplexer, configured to multiply the frequency of the second output signal of the push-push oscillator,
   wherein the first output of the push-push oscillator is directly wired to an input of the phase detector, wherein the duplexer is coupled to the at least one antenna such that the transmission signal is emittable via the at least one antenna based on the second output signal of the push-push oscillator,
wherein the phase detector comprises a reference input configured to receive reference frequency signals and a phase detector output that is coupled to a control input of the push-push oscillator, and
wherein the phase detector is configured to detect a phase difference between the reference frequency signal and the second output signal of the push-push oscillator, and to transmit, at the phase detector output, a regulation signal configured to regulate the push-push oscillator, the regulation signal being correlated with the detected phase difference, to the control input of the push-push oscillator.

2. The radar fill level measurement device according to claim 1,
wherein the first output signal of the push-push oscillator has a fundamental frequency of the push-push oscillator, or
wherein the second output signal of the push-push oscillator has a frequency of a first harmonic of the push-push oscillator, or
wherein the first output signal of the push-push oscillator has a fundamental frequency of the push-push oscillator and the second output signal of the push-push oscillator has a frequency of a first harmonic of the push-push oscillator.

3. The radar fill level measurement device according to claim 1,
wherein a frequency of the second output signal of the push-push oscillator is double that of a frequency of the first output signal of the push-push oscillator.

4. The radar fill level measurement device according to claim 1,
wherein the frequency multiplier is configured to boost a frequency of the second output signal by at least a factor of 4.

5. The radar fill level measurement device according to claim 1,
wherein the radar module is configured as at least one module selected from the group consisting of a V-band radar module, an E-band radar module, a W-band radar module, an F-band radar module, a D-band radar module, a G-band radar module, a Y-band radar module, and a J-band radar module.

6. The radar fill level measurement device according to claim 1,
wherein the phase-locked loop further comprises a loop filter, coupled between the phase detector output of the phase detector and the control input of the push-push oscillator, being configured to filter the regulation signal of the phase detector.

7. The radar fill level measurement device according to claim 1, further comprising:
a frequency mixer, coupled to the duplexer, configured to generate an intermediate frequency signal based on the transmission signal and on the received signal.

8. The radar fill level measurement device according to claim 1, further comprising:
a digital controller configured to control, by digital control signals, the phase-locked loop, or the phase detector, or the phase-locked loop and the phase detector.

9. The radar fill level measurement device according to claim 8,
wherein the radar fill level measurement device is configured as a frequency-modulated continuous-wave (FMCW) radar, or
wherein the radar fill level measurement device is configured as a stepped-frequency continuous-wave (SFCW) radar, or
wherein the radar fill level measurement device is configured as a FMCW radar and as a SFCW radar.

10. The radar fill level measurement device according to claim 8,
wherein the digital controller is further configured to detect, based on an intermediate frequency signal transmitted by a frequency mixer of the radar fill level measurement device, a distance from the surface of the medium, or to detect a fill level of the medium, or to detect a distance from the surface of the medium and to detect a fill level of the medium.

11. The radar fill level measurement device according to claim 1, further comprising at least one component selected from among:
an amplifier configured to amplify an intermediate frequency signal transmitted by a frequency mixer of the radar fill level measurement device;
a filter coupled between a digital controller and a frequency mixer of the radar fill level measurement device; and
an analogue-digital converter coupled between a digital controller and a frequency mixer of the radar fill level measurement device, and being configured to generate a digital measurement signal correlated with an intermediate frequency signal transmitted by the frequency mixer.

12. The radar fill level measurement device according to claim 1, further comprising:
a reference oscillator coupled to the reference input of the phase detector and being configured to generate reference frequency signals.

13. The radar fill level measurement device according to claim 1, further comprising:
an amplifier coupled to the second output of the push-push oscillator and being configured to amplify the second output signal of the push-push oscillator.

14. A method for operating a radar fill level measurement device according to claim 1, the method comprising:
generating, by the radar module of the radar fill level measurement device, a transmission signal, which has a frequency of at least 60 GHz;
emitting, by the at least one antenna of the radar fill level measurement device, the transmission signal towards the surface of a medium;
receiving, by the at least one antenna of the radar fill level measurement device, a signal reflected from the surface of the medium;
mixing, by a frequency mixer of the radar fill level measurement device, the transmission signal and the received signal so as to generate an intermediate frequency signal; and
evaluating, by a digital controller of the radar fill level measurement device, a digital measurement signal correlated with the generated intermediate frequency signal so as to detect a distance of the radar fill level measurement device from the surface of the medium, or to detect a fill level of the medium, or to detect a distance of the radar fill level measurement device from the surface of the medium and to detect a fill level of the medium.

15. The method for operating the radar fill level measurement device according to claim 14, further comprising determining the fill level of a medium.

\* \* \* \* \*